United States Patent
Ishikawa et al.

(10) Patent No.: US 10,201,879 B2
(45) Date of Patent: Feb. 12, 2019

(54) SILVER PASTE COMPOSITION AND SEMICONDUCTOR DEVICE USING SAME

(71) Applicant: HITACHI CHEMICAL COMPANY, LTD., Chiyoda-ku, Tokyo (JP)

(72) Inventors: Dai Ishikawa, Tsukuba (JP); Hiroshi Matsumoto, Tsukuba (JP); Michiko Natori, Tsukuba (JP); Hideo Nakako, Tsukuba (JP); Toshiaki Tanaka, Tsukuba (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 14/425,980

(22) PCT Filed: Aug. 5, 2013

(86) PCT No.: PCT/JP2013/071170
§ 371 (c)(1),
(2) Date: Mar. 4, 2015

(87) PCT Pub. No.: WO2014/038331
PCT Pub. Date: Mar. 13, 2014

(65) Prior Publication Data
US 2015/0217411 A1 Aug. 6, 2015

(30) Foreign Application Priority Data
Sep. 5, 2012 (JP) .................. 2012-195392

(51) Int. Cl.
*B23K 35/30* (2006.01)
*B23K 35/02* (2006.01)
*B23K 35/362* (2006.01)
*C22C 5/06* (2006.01)
(Continued)

(52) U.S. Cl.
CPC ........ *B23K 35/3006* (2013.01); *B23K 35/025* (2013.01); *B23K 35/362* (2013.01);
(Continued)

(58) Field of Classification Search
None
See application file for complete search history.

(56) References Cited

U.S. PATENT DOCUMENTS

2009/0042001 A1* 2/2009 Miyazaki ............ H01B 1/16
428/220
2009/0236404 A1* 9/2009 Yamakawa ............ B22F 1/004
228/123.1
(Continued)

FOREIGN PATENT DOCUMENTS

CN 101911219 A 12/2010
CN 101918505 A 12/2010
(Continued)

OTHER PUBLICATIONS

European Patent Office International Search Report, dated Jan. 14, 2016, from corresponding European Patent Application 13835695.1, 6 pages.
(Continued)

*Primary Examiner* — Katie L. Hammer
(74) *Attorney, Agent, or Firm* — Fitch, Even, Tabin & Flannery, LLP (57) ABSTRACT

A silver paste composition comprising silver particles having a particle diameter of 0.1 μm to 20 μm, and a solvent, wherein the above-described solvent comprises a solvent having a boiling point of 300° C. or more.

26 Claims, 4 Drawing Sheets

(51) Int. Cl.
  *H01L 23/00* (2006.01)
  *H01B 1/22* (2006.01)
  *H01L 23/31* (2006.01)
(52) U.S. Cl.
  CPC .............. *C22C 5/06* (2013.01); *H01B 1/22* (2013.01); *H01L 24/29* (2013.01); *H01L 24/32* (2013.01); *H01L 24/83* (2013.01); *H01L 23/3107* (2013.01); *H01L 23/3121* (2013.01); *H01L 24/27* (2013.01); *H01L 24/73* (2013.01); *H01L 24/92* (2013.01); *H01L 2224/2732* (2013.01); *H01L 2224/2929* (2013.01); *H01L 2224/29139* (2013.01); *H01L 2224/29339* (2013.01); *H01L 2224/32221* (2013.01); *H01L 2224/32225* (2013.01); *H01L 2224/32245* (2013.01); *H01L 2224/48091* (2013.01); *H01L 2224/48227* (2013.01); *H01L 2224/48247* (2013.01); *H01L 2224/73265* (2013.01); *H01L 2224/8384* (2013.01); *H01L 2224/83192* (2013.01); *H01L 2224/92247* (2013.01); *H01L 2924/014* (2013.01); *H01L 2924/10253* (2013.01); *H01L 2924/12032* (2013.01); *H01L 2924/12041* (2013.01); *H01L 2924/12042* (2013.01); *H01L 2924/1301* (2013.01); *H01L 2924/13055* (2013.01); *H01L 2924/13091* (2013.01); *H01L 2924/15747* (2013.01); *H01L 2924/181* (2013.01); *H01L 2924/203* (2013.01); *H01L 2924/2064* (2013.01)

(56) References Cited

U.S. PATENT DOCUMENTS

2010/0051319 A1* 3/2010 Schmitt ............. B23K 35/3006
                                                                174/126.1
2010/0270515 A1* 10/2010 Yasuda ................. B22F 1/0074
                                                                252/514
2010/0301479 A1   12/2010 Yang et al.
2011/0180139 A1    7/2011 Adachi et al.
2011/0290863 A1   12/2011 Kajiwara et al.

FOREIGN PATENT DOCUMENTS

| JP | 11-066953 A | 3/1999 |
|---|---|---|
| JP | 2004-273205 A | 9/2004 |
| JP | 2005-093996 A | 4/2005 |
| JP | 2006-083377 A | 3/2006 |
| JP | 2006-302834 A | 11/2006 |
| JP | 4353380 B2 | 3/2007 |
| JP | 2009-245844 A | 10/2009 |
| JP | 2010-257880 A | 11/2010 |
| JP | 2012-023088 A | 2/2012 |
| JP | 2013-131385 A | 7/2013 |
| JP | 2006-073811 A | 3/2016 |
| TW | 201110146 A | 3/2011 |
| WO | WO-2011/114747 A1 | 9/2011 |
| WO | WO-2011-155615 A1 | 12/2011 |
| WO | 2012/014481 A1 | 2/2012 |

OTHER PUBLICATIONS

International Preliminary Report of Appln. No. WO PCT/JP2013/071170 dated Mar. 19, 2015 in English.

Chinese Patent Office Office Action dated Jan. 19, 2016, from corresponding Chinese Patent Application 201380043064.3, 7 pages.

Office Action of counterpart Taiwan Appln. No. 102129510 dated Aug. 10, 2016.

Notice of Allowance of counterpart JP Patent Application No. P2014-534251 dated Jun. 20, 2017.

* cited by examiner

SILVER PASTE COMPOSITION AND SEMICONDUCTOR DEVICE USING SAME

TECHNICAL FIELD

The present invention relates to a silver paste composition and a semiconductor device using the same. More specifically, the present invention relates to a silver paste composition used for bonding a semiconductor element, such as a power semiconductor, an LSI, or a light-emitting diode (LED), to a substrate, such as a lead frame, a ceramic wiring board, a glass epoxy wiring board, or a polyimide wiring board, and a semiconductor device using the same.

BACKGROUND ART

In manufacturing a semiconductor device, as a method for bonding a semiconductor element to a lead frame, there is a method in which a paste formed by dispersing a filler such as silver powders in a binder resin such as an epoxy resin or a polyimide resin is used as an adhesive agent. In this method, after applying the paste adhesive agent to a die pad of a lead frame using a dispenser, a printing machine, a stamping machine, or the like, a semiconductor element is die-bonded and bonded by heat hardening to form a semiconductor device.

As an adhesive agent used for such an intended purpose, for example, a composition in which a binder resin is highly filled with silver particles having high thermal conductivity, disclosed in Patent Literatures 1 to 3, a composition using solder particles, disclosed in Patent Literature 4, a composition using metallic nanoparticles which excel in a sintering property, disclosed in Patent Literature 5, and an adhesive composition in which micro-size silver particles subjected to special surface treatment are used and the silver particles are sintered by application of heat at 100° C. or more and 400° C. or less, disclosed in Patent Literature 6 have been proposed.

CITATION LIST

Patent Literature

Patent Literature 1: Japanese Patent Application Laid-Open No. 2006-73811
Patent Literature 2: Japanese Patent Application Laid-Open No. 2006-302834
Patent Literature 3: Japanese Patent Application Laid-Open No. 11-66953
Patent Literature 4: Japanese Patent Application Laid-Open No. 2005-93996
Patent Literature 5: Japanese Patent Application Laid-Open No. 2006-83377
Patent Literature 6: Japanese Patent No. 4353380

SUMMARY OF INVENTION

Technical Problem

Incidentally, regarding the adhesive composition used for the above-described intended purpose, in the case where the number of steps required for bonding is reduced so as to save manufacturing cost of the semiconductor device, for example, a high adhesive property is strongly required even when a preheating process is omitted. In addition, for securing the operational stability of the semiconductor device, a sufficient thermal conductive property and electrical conductive property are also required. However, the conventional adhesive composition cannot satisfy all of these necessary properties.

In view of such a problem, it is an object of the present invention to provide a silver paste composition which exhibits a high adhesive property by only a one-step sintering step and in which a silver hardened body obtained by hardening the silver paste composition after bonding has a sufficient thermal conductive property and electrical conductive property, and a semiconductor device using the same.

Solution to Problem

The present inventors found that a silver paste composition comprising silver particles having a particle diameter of 0.1 μm to 20 μm, and a solvent, wherein the above-described solvent comprises a solvent having a boiling point of 300° C. or more, exhibits a high adhesive property by only a one-step hardening step, and that a silver hardened body obtained by hardening the silver paste composition after bonding has a sufficient thermal conductive property and electrical conductive property.

From the viewpoint of more increasing the adhesive strength, the above-described silver particles are preferably flaky silver particles and/or spherical silver particles.

Moreover, from the viewpoint that the adhesive property, the thermal conductive property, and the electrical conductive property of the silver sintered body obtained by sintering the silver paste composition become better, the above-described solvent preferably has at least one of an ether structure, an ester structure, and a hydroxyl structure.

Furthermore, in the silver paste composition, the silver particles are sintered by application of heat at less than 300° C. so that a silver sintered body is formed, and volume resistivity, thermal conductivity, and adhesive strength of the silver sintered body are preferably $1 \times 10^{-4}$ Ω·cm or less, 30 W/m·K or more, and 10 MPa or more respectively. It is to be noted that the above-described adhesive strength means adhesive strength when sintering the silver particles for 10 to 120 minutes at 180 to 300° C. in the atmosphere, using a noble metal (Ag, Au, Pd, Pt) as an object to be bonded.

Moreover, the present invention provides a semiconductor device having a structure in which a semiconductor element and a supporting member for mounting a semiconductor element are bonded via the above-described silver paste composition.

Advantageous Effects of Invention

According to the present invention, a silver paste composition which exhibits a high adhesive property by only a one-step sintering step and in which a silver hardened body obtained by hardening the silver paste composition after bonding has a sufficient thermal conductive property and electrical conductive property, and a semiconductor device using the same can be provided.

DESCRIPTION OF EMBODIMENT

Hereinafter, one embodiment of the present invention will be described in detail, but the present invention is not limited thereto.

As silver particles of the present embodiment, those having a particle diameter of 0.1 µm to 20 µm are used. When the particle diameter becomes less than 0.1 µm, the volume ratio of the silver particles to organic substances adsorbed on the surface of the silver particles, such as a solvent, becomes relatively small. By sintering such silver particles, the degree of volumetric shrinkage becomes large, and voids are easy to be formed in the silver sintered body. As a result, such silver particles having a particle diameter of less than 0.1 µm are not preferable because the electrical conductive property, the thermal conductive property, and the adhesive strength are decreased. In addition, in the case of the silver particles having a particle diameter of less than 0.1 µm, the manufacturing cost tends to be higher than in the case of the silver particles having a particle diameter within the above-described range. On the other hand, when the particle diameter exceeds 20 µm, voids in the case where the particles are close-packed become large, thereby resulting in a decrease in the density in the silver sintered body. As a result, such silver particles having a particle diameter of more than 20 µm are not preferable because the electrical conductive property, the thermal conductive property, and the adhesive strength are decreased. It is to be noted that the particle diameter of the silver particles is preferably 0.5 µm to 15 µm, and more preferably 1 to 10 µm.

The particle diameter of the silver particles in the present description is a sphere equivalent diameter that is a volume average of primary particles, determined by the laser scattering particle size distribution measurement. Specifically, the particle diameter in the silver paste composition is determined by the laser scattering particle size distribution measurement.

An example of the measurement method is shown below. 0.01 g of the silver paste composition, 0.1 g of sodium dodecylbenzenesulfonate (manufactured by Wako Pure Chemical Industries, Ltd.), and 99.9 g of distilled water (manufactured by Wako Pure Chemical Industries, Ltd.) are mixed and subjected to treatment with an ultrasonic bath for 5 minutes to obtain a water dispersion. A laser scattering particle size distribution analyzer LS 13 320 (manufactured by Beckman Coulter, Inc.) fitted with a universal liquid module having an ultrasonic dispersion unit is left to stand for 30 minutes after turning on a main unit power source for stabilizing a light source, the distilled water to which 0.1 mass % of sodium dodecylbenzenesulfonate is added is charged in the liquid module with a Rinse command of a measurement program, and De-bubble, Measure Offset, Align, and Measure Background of the measurement program are performed. Subsequently, using Measure Loading of the measurement program, the water dispersion that has been shaken to become uniform is added to the liquid module with a dropper until the sample amount turns from Low to OK in the measurement program. Subsequently, dispersion treatment is performed for 1 minute with Power 5 by the ultrasonic dispersion unit, and then, degassing is performed. Then, measurement of the measurement program is performed to obtain particle size distribution. As the settings for the laser scattering particle size distribution analyzer, Pump Speed: 70%, Include PIDS data: ON, Run Length: 90 seconds, dispersing medium refractive index: 1.332, and dispersed substance refractive index: 0.23 are used.

Although particle size distribution having a plurality of peaks including peaks of aggregates other than the primary particles is usually obtained by this measurement, the particle size distribution of the primary particles is obtained using one peak of the lowest particle diameter as a processing range.

The shape of the silver particles is not particularly limited, and spherical particles, flaky particles, plate-like particles, columnar particles, and the like can be arbitrarily used. In particular, in order to increase the adhesive strength for a semiconductor element or a supporting member, it is preferable to use flaky particles or plate-like particles by which the adhesive area to the semiconductor element or the supporting member becomes large. Furthermore, in order to increase the packing density between particles, two or more types of particles having a different particle diameter or shape can be mixed to be used.

The amount of the silver particles in the silver paste composition can be arbitrarily decided in accordance with the viscosity and the thixotropy of the intended silver paste composition. The silver particles are preferably 80 parts by mass or more in 100 parts by mass of the silver paste composition so as to exhibit a sufficient thermal conductive property of the silver sintered body. It is to be noted that, although the upper limit of the amount of the silver particles in the silver paste composition is not particularly limited, for example, it can be less than 97 parts by mass in 100 parts by mass of the silver paste composition.

As the surface state of the silver particles, the state ratio of oxygen derived from a silver oxide is preferably less than 15%. Depending on a combination with a solvent, if a silver oxide exists on the surface, sintering may be inhibited. In order to remove the silver oxide on the surface, by arbitrarily performing acid treatment or the like, another surface protective agent that covers the surface of the silver particles may be adsorbed. As the surface protective agent, carboxylic acids, alcohols, and the like having a boiling point of 300° C. or more are preferable.

As the solvent in the present embodiment, one having a boiling point of 300° C. or more is used. The term boiling point here is a value measured by either method of distillation or GC-MS at atmospheric pressure (1013 hPa). In addition, the solvent in the present embodiment may be either a liquid or a solid at ordinary temperature. For example, the solvent can be selected from the group of alcohols, aldehydes, ethers, esters, amines, monosaccharides, polysaccharides, straight-chain hydrocarbons, fatty acids, and aromatics having a boiling point of 300° C. or more. One of these solvents can be used alone or a plurality of these solvents can be used in combination. It is preferable to select the solvent suitable for dispersion of the silver particles, from the above-described group. Specifically, it is particularly preferable to use a solvent having an ether structure, an ester structure, or a hydroxyl structure because the thermal conductive property, the electrical conductive property, and the adhesive strength of the silver sintered body after the sintering become better. It is to be noted that the boiling point of the solvent is preferably more than 300° C., and more preferably 305° C. or more. In addition, although the upper limit of the boiling point of the solvent in the present embodiment is not particularly limited, it can be 400° C. or less.

Specific examples of the solvent having a boiling point of 300° C. or more include isobornyl cyclohexanol, tributyrin, stearic acid, methyl stearate, ethyl stearate, propyl stearate, butyl stearate, 2-ethylhexyl stearate, octyl stearate, stearyl stearate, octyl octanoate, ethyl myristate, methyl myristate, methyl linoleate, tributyl citrate, bis ethylhexyl adipate, adipic acid dibutyl ester, diethyl sebacate, dibutyl sebacate, oleyl alcohol, cetyl alcohol, methoxyphenethyl alcohol, diglycerine, tetraethylene glycol, pentaethylene glycol, hexaethylene glycol, benzyl benzoate, γ-phenyl-γ-butyrolactone, dibenzo(a,h)anthracene, benzo(a)anthracene, palmitic acid, cholesterol, linolenic acid, alizarin, triphenylmethanol, 9,10-phenanthrenequinone, o-terphenyl, anthraquinone, dibutyl phthalate, phenanthrene, butyl benzyl phthalate, 1-naphthoic acid (α-naphthoic acid), pyrogallol, L-dibutyl tartrate, xanthone, coumarin, m-terphenyl, 6-methylcoumarin, 4-phenylphenol, xanthene, 4-acetylbiphenyl, 1,4-diphenylbenzene, 2-acetylnaphthalene, 2-naphthoic acid (β-naphthoic acid), benzoic anhydride, phenyl benzoate, chalcone, 4-benzylphenol, dibenzyl ketone, diphenyl carbonate, trans-stilbene, benzyl benzeneacrylate, stearic acid 11-hydroxy-3,6,9-trioxaundecane-1-yl ester, fumaric acid, glutaric acid, squalane, pimelic acid, oleic acid, eicosane, α-santalol, bis(2-ethylhexyl)phthalate, bis(2-methoxyethyl) phthalate, benzyl salicylate, benzoin, benzophenone, anthracene, dodecylbenzene, tridecylbenzene, 4-hydroxybenzaldehyde, adipic acid, MGK Repellent 11, methyl abietate, pyrene, dipropyl phthalate, dipentyl phthalate, 2-methylbenzophenone, benzyl, 4-hexylresorcinol, cinnamic acid, erythritol, coronene, benzo[ghi]perylene, indeno[1,2,3-cd]pyrene, 4H-cyclopenta[def]phenanthrene, fluoranthene, benzo[k]fluoranthene, picene, dibenzo[a,c]anthracene, triphenylene, chrysene, 11H-benzo[a]fluorene, deoxybenzoin, retene, fluorenone, 2,4,5-trimethoxybenzoate, flavan, dypnone, benzofuran-2-carboxylic acid, diphenylacetylene, suberic acid, heptadecanoic acid, arachidic acid, triphenylmethane, muscone, myristic acid, dotriacontane, trimellitic anhydride, tripalmitin, timyristin, biphenyl-3-ol, stilbene, octadecane, heptacosane, 9-phenylanthracene, 1-phenylnaphthalene, bis(2-ethoxyethyl)phthalate, methyl 2-benzoylbenzoate, diethyl 2-benzylmalonate, 1-benzylnaphthalene, 4-methoxybenzophenone, 4,4'-dimethylbenzophenone, 1,3,5-triphenylbenzene, 2,2'-binaphthyl, 2-phenylnaphthalene, 1,2,4-triacetoxybenzene, 9,10-dihydroanthracene, 2-benzylnaphthalene, 4-methylphenyl benzoate, 2-methylphenyl benzoate, triisovalerin, diphenyl succinate, benzeneacrylic acid, heptadecane, nonadecane, henicosane, 1-icosanol, docosane, pentacosane, hexacosane, octacosane, nonacosane, hentriacontane, pentatriacontane, tetraphenylmethane, tetraphenylethene, diethyl terephthalate, diethyl isophthalate, tridecanoic acid, tricosane, triacontane, o-quaterphenyl, 3-methylbenzophenone, nonadecanoic acid, tetracosane, 1-phenyl-3-(2-furanyl)-2-propene-1-one, 1,1-diphenylacetone, 3-methylphenanthrene, 2,2'-dihydroxybenzophenone, 2'-methyl-4'-hydroxyacetophenone, 1,4-diphenyl-1,3-butadiene, biphenyl-2-carboxylic acid, 2,5-diphenylfurane, pentadecanoic acid, 1,3-diphenylpropane, 1,4-diphenylbutane, 2,4-dimethylbenzophenone, phthalic acid 1-(8-methylnonyl)2-octyl ester, 1-heptadecanol, hexadecylbenzene, tetradecylbenzene, dimethyl brassylate, 2-methylheptadecane, 1-docosene, tricyclohexylmethane, dodecylcyclohexane, tetradecylcyclohexane, 2,2'-biphenol, perhydrochrysene, pentadecylbenzene, L-tartaric acid dipropyl, 2-phenoxybenzoic acid, 4-phenyl-3-butenoic acid, octyl octanoate, icosylbenzene, 3,4-dimethylbenzophenone, 2-heptadecanone, 2-naphthoic acid ethyl ester, 1-naphthoic acid ethyl ester, 1-(2,4-dihydroxyphenyl)-1-hexanone, trimellitic acid tris(2-ethylhexyl)ester, 1-icosene, β-phenylbenzene-1-propanol, 1,1,3-trimethyl-3-phenylindane, icosylcyclohexane, octadecylcyclohexane, octadecylbenzene, 1-naphthalenemethanol, tridecylcyclohexane, pentadecylcyclohexane, 2-hydroxyhexanoic acid, 3,3'-dimethoxy biphenyl, 1,4-dicyclohexylbutane, 1-(2-naphthyl)-1-propanone, bis(2-ethylhexyl)terephthalate, henicosylcyclopentane, undecylbenzene, 1-heptadecene, hexadecylcyclohexane, tetratetracontane, heptatriacontane, octatriacontane, tetratriacontane, heptadecylbenzene, 2-hexadecanol, 1-nonadecene, heptadecylcyclohexane, nonadecylcyclohexane, 1-nonylnaphthalene, dodecylphenol, (Z)-9-tricosene, 2-benzylphenol, nonadecylbenzene, 1-hexadecanol, 1,1'-(1,5-pentanediyl)biscyclohexane, 1,1'-(2-ethyl-1,3-propanediyl) biscyclohexane, 2-nonylnaphthalene, civetone, cinmethylin, benzyldiglycol, and polyoxyethylene glyceryl isostearate.

The boiling point of the solvent contained in the silver paste composition can be measured by a method of distillation or GC-MS.

The boiling point measurement method by distillation will be described using a silver paste composition of Example 2 as an example. 440 g of acetone is added to 1050 g of the silver paste composition, and stirring is performed. This solution is suction-filtered using filter paper having a micropore diameter of about 1 μm (manufactured by ADVANTEC, for quantitative analysis No. 4A) to separate into a solid component and a solvent component. About 930 g of the solid component and about 560 g of the solvent component are obtained. The composition of the solid component is about 920 g of the Ag particles and about 10 g of stearic acid that has low solubility in acetone. The composition of the solvent component is about 440 g of acetone and about 120 g of tributyrin. 560 g of the recovered solvent component is heated at 50° C. for 3 hours while stirring to evaporate acetone. After the heating, about 120 g of the solvent remains. This solvent is charged in a distillation flask (NIPPON RIKAGAKU KIKAI CO., LTD., capacity: 500 mL) to which a condenser is connected. Moreover, a probe of a digital temperature indicator (Anritsu Meter Co., Ltd., HFT-50) is placed on the position of a distillation head of the distillation flask. The distillation flask is gradually heated in a sand bath while letting water flow in the condenser, and the solvent is confirmed to boil at 303° C. to 305° C. Accordingly, it can be decided that the boiling point of the solvent, tributyrin is 303° C. to 305° C. under atmospheric pressure.

In the case where two or more types of solvents are contained, when a boiling point difference between the solvents is sufficient, boiling point measurement of the respective solvents is possible by distillation. In the case where the boiling points are close, the boiling points of the respective solvents can be determined by arbitrarily using a method for measuring the boiling points after separating the solvents by fractional distillation, or a method of GC-MS described below.

The boiling point measurement method by GC-MS will be described. By using GC/MS QP-5050A (manufactured by Shimadzu Corporation) having Curie Point Pyrolyzer JHP-3 (manufactured by Japan Analytical Industry Co., Ltd.) as an introduction device, 0.1 mL, of the silver paste composition is introduced into the pyrolyzer and gasified under the condition of 315° C./10 sec to be introduced into the GC/MS. Capillary Column UA-5 (manufactured by Frontier Laboratories Ltd.) having a diameter of 0.25 mm and a length of 30 m is attached to the GC/MS, and helium is used as a carrier gas at 50 mL/min. The gas generated in the pyrolyzer is introduced into the capillary column, and the gas component is adsorbed, and then, the temperature of the column is elevated from 50° C. to 300° C. at 10° C./min, and the desorbed gas is analyzed by mass spectrum. The solvent can be identified by checking the data of the mass spectrum against the database. When the solvent is identified, the boiling point thereof, as a substance-specific value, can be obtained from the database.

The amount of the solvent in the silver paste composition is preferably less than 20 parts by mass in 100 parts by mass of the silver paste composition. When the solvent is 20 parts by mass or more, the degree of volumetric shrinkage due to the volatilization of the solvent when sintering the silver paste composition becomes large, and the compactness of the formed silver sintered body may be decreased. It is to be noted that, although the lower limit of the amount of the solvent in the silver paste composition is not particularly limited, it can be 3 parts by mass or more in 100 parts by mass of the silver paste composition.

In order to manufacture the silver paste composition of the present embodiment, by arbitrarily combining dispersing/dissolving devices such as a stirrer, a stone mill, a three-roll mill, and a planetary mixer, the silver particles and the solvent having a boiling point of 300° C. or more are collectively or separately heated if needed, mixed, dissolved, disaggregated/kneaded, or dispersed, together with various additive agents added if needed, to be a uniform paste.

A method for heating the silver paste composition of the present embodiment may follow a conventional method. In addition to external heating by a heater, an ultraviolet lamp, a laser, a microwave, and the like can be preferably used. The heating temperature is preferably less than 300° C. Heating at 300° C. or more causes bumping of the solvent, and voids are formed in the silver sintered body. As a result, the density of the silver sintered body is decreased, and properties such as the thermal conductive property, the electrical conductive property, and the adhesive strength are also decreased. The more preferable range is 150° C. or more and 280° C. or less. When the temperature is less than 150° C., the volatilization of the solvent hardly occurs, and it becomes difficult to sinter the silver paste composition. In the range of 150° C. or more and 280° C. or less, the volatilization of the solvent occurs moderately, and the sintering of the silver particles proceeds well at the same time.

In addition, the presence or absence of a preheating step when heating the silver paste composition can be arbitrarily decided. When sintering the silver paste composition, preheating is usually performed to prevent the solvent from bumping, and the solvent is made to be volatilized in advance. However, since a solvent having a high boiling point is used in the silver paste composition in the present embodiment and bumping of the solvent does not occur at less than 300° C. that is a usual temperature to connect a semiconductor device, a preheating step is unnecessary. Therefore, a manufacturing process of a semiconductor device can be simplified, and manufacturing cost can be decreased.

The rate of temperature increase when heating the silver paste composition is not particularly limited as long as the attainment temperature is less than 300° C. When sintering at 300° C. or more, in order to prevent the solvent from bumping, it is preferable to make the rate of temperature increase be 1° C./sec or less, or to perform a preheating step.

The sintering of the silver paste composition of the present embodiment is described as follows. When the silver paste composition is heated at 150° C. or more and less than 300° C., the solvent having a boiling point of 300° C. or more gradually volatilizes at the temperature. During the volatilization of the solvent, sintering starts between the silver particles. In other words, a sintering reaction proceeds in the presence of the solvent (liquid phase). This means that, since the silver particles have fluidity, the sintering proceeds in a state where it is easy to be a more compact state. Accordingly, a more compact silver sintered body than a conventional silver paste composition can be formed, and one which excels in bonding strength and has a sufficient thermal conductive property and electrical conductive property can be obtained.

The volume resistivity of the hardened adhesive composition (silver sintered body) is preferably $1 \times 10^{-4}$ Ω·cm or less, and the thermal conductivity is preferably 30 W/m·K or more. It is to be noted that, although the lower limit of the volume resistivity of the silver sintered body is not particularly limited, it is, for example, $1.6 \times 10^{-6}$ Ω·cm. In addition, although the upper limit of the thermal conductivity is not particularly limited, it is, for example, 300 W/m·K or less.

A semiconductor device of the present embodiment can be obtained by bonding a semiconductor element to a supporting member using the above-described silver paste composition. After bonding the semiconductor element to the supporting member, a wire bonding step and a sealing step are performed if needed. Examples of the supporting member include lead frames such as a 42 alloy lead frame, a copper lead frame, and a palladium PPF lead frame; and organic substrates such as a glass epoxy substrate (substrate made of glass fiber-reinforced epoxy resin), and a BT substrate (substrate using BT resin made of cyanate monomer and oligomer thereof, and bismaleimide).

In order to bond the semiconductor element to the supporting member, such as a lead frame, using the silver paste composition of the present embodiment, the adhesive composition is first applied to the supporting member by a dispensing method, a screen printing method, a stamping method, or the like, then the semiconductor element is mounted, and the sintering is performed using a heating device. After the sintering, a wire bonding step is performed and sealing is performed to complete the semiconductor device.

<Semiconductor Device>

The semiconductor device can be used for a power module such as a diode, a rectifier, a thyristor, a MOS gate driver, a power switch, a power MOSFET, an IGBT, a schottky diode, and a fast recovery diode; a transmitter; an amplifier; an LED module; and the like. The power module, transmitter, amplifier, and LED module to be obtained have a high adhesion property, high thermal conductive property, high conductive property, and high heat resistance property between the semiconductor element and the supporting member for mounting a semiconductor element.

Figure 3:
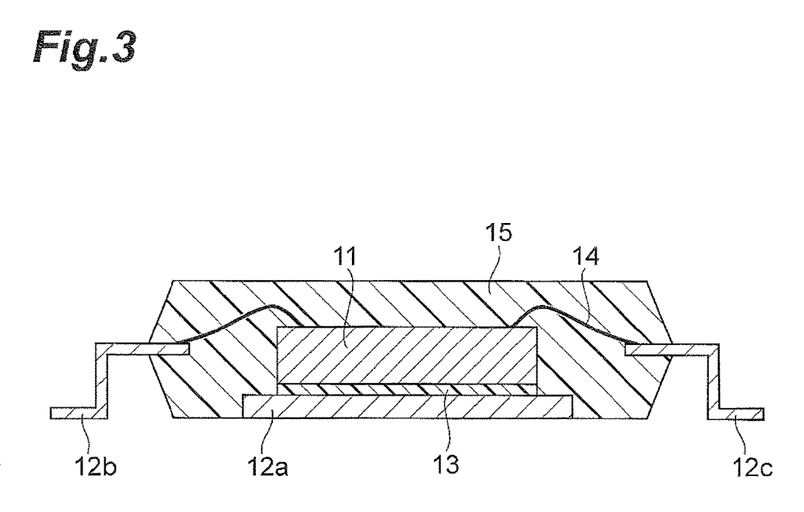
FIG. 3 is a schematic cross-sectional diagram illustrating an example of a semiconductor device manufactured by using an adhesive composition of the present embodiment.

FIG. 3 is a schematic cross-sectional diagram illustrating an example of the semiconductor device manufactured by using the adhesive composition of the present embodiment. A semiconductor device illustrated in FIG. 3 comprises three lead frames (heat radiators) 12a, 12b, 12c, a chip (heat generator) 11 connected to the lead frame 12a via the adhesive composition 13 of the present embodiment, and a mold resin 15 for molding these. The chip 11 is connected to the lead frames 12b, 12c via two wires 14, respectively.

Figure 4:
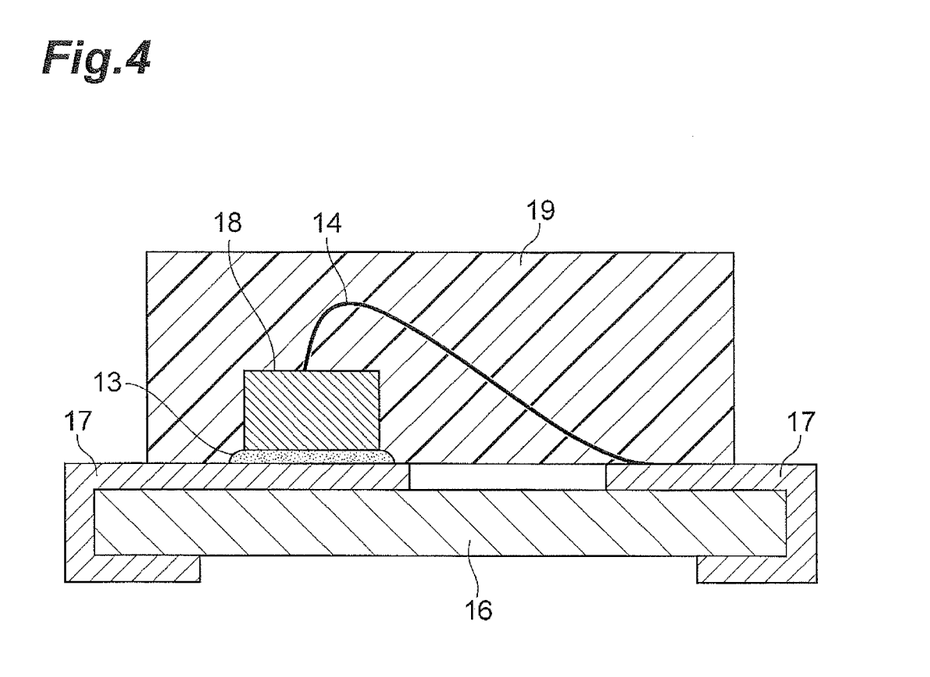
FIG. 4 is a schematic cross-sectional diagram illustrating another example of the semiconductor device manufactured by using the adhesive composition of the present embodiment.

FIG. 4 is a schematic cross-sectional diagram illustrating another example of the semiconductor device manufactured by using the adhesive composition of the present embodiment. A semiconductor device illustrated in FIG. 4 comprises a substrate 16, two lead frames 17 formed so as to surround the substrate 16, an LED chip 18 connected to the lead frame 17 via the adhesive composition 13 of the present embodiment, and a translucent resin 19 for sealing these. The LED chip 18 is connected to the lead frame 17 via a wire 14.

EXAMPLES

Examples are described below, and the present invention will be more specifically described, but the present invention is not limited to these Examples.

The measurement of each property in each Example was performed as follows.

(1) Presence or Absence of Voids in Silver Sintered Body 0.1 mg of the silver paste composition was applied onto a PPF-Cu lead frame (land: 10×5 mm), and a 1 mm×1 mm Au-plated Si chip (Au plating thickness: 0.1 µm, chip thickness: 400 µm) was bonded thereon. This was heated for 60 minutes at 200° C. on a hot plate (Iuchi Seieido Co. Ltd., SHAMAL HOTPLATE RHP-401) to manufacture a silver sintered body. It is to be noted that the rate of temperature increase until the temperature reached 200° C. from room temperature (25° C.) was about 27° C./sec. Here, the above-described PPF is an abbreviation for Palladium Pre Plated, and moreover, the above-described PPF-Cu lead frame is one in which Ni plating is performed on a Cu lead frame, palladium plating is performed thereon, and Au plating is further performed thereon.

Figure 1:
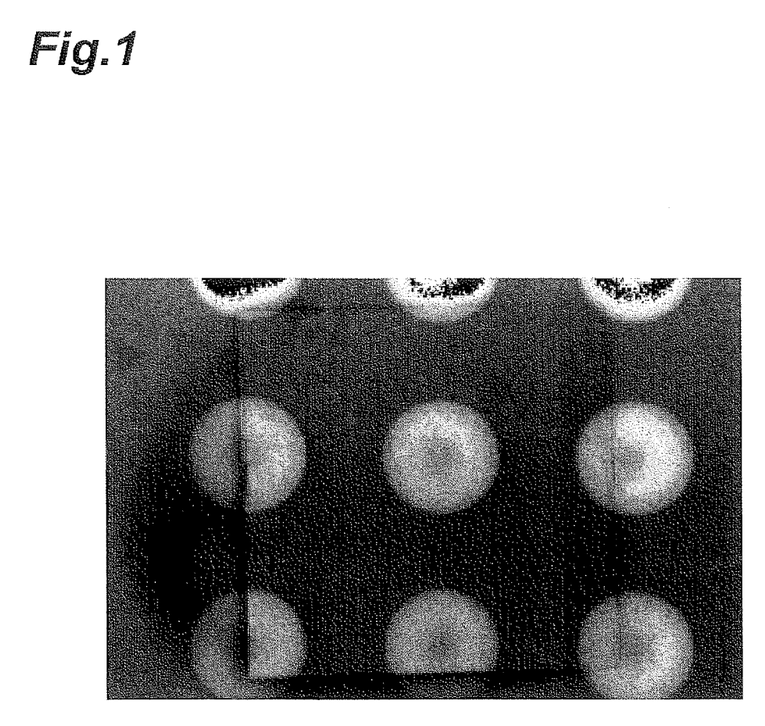
FIG. 1 is an X-ray image of a silver sintered body obtained in Example 1.
Figure 2:
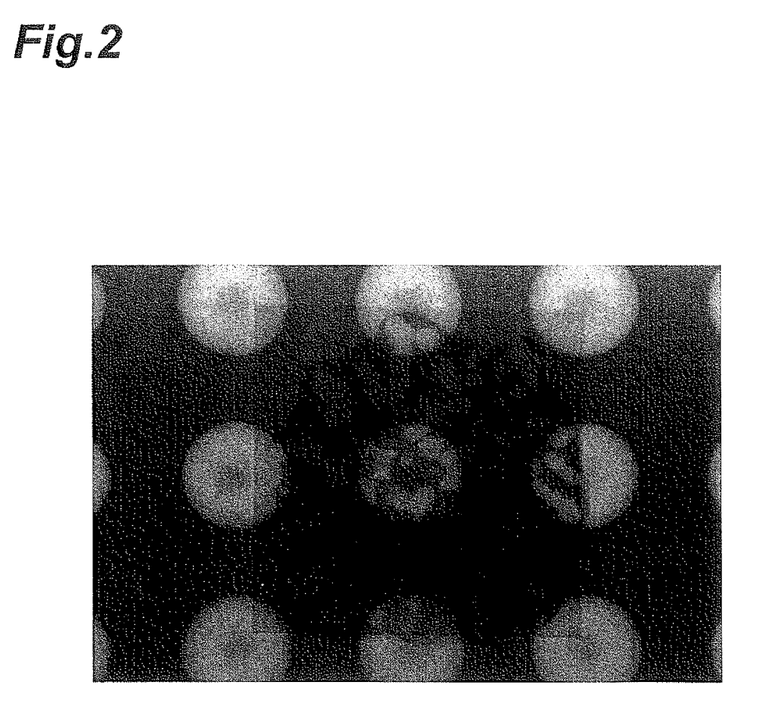
FIG. 2 is an X-ray image of a silver sintered body obtained in Comparative Example 1.

By directly observing the above-described silver sintered body with a micro focus X-ray device (Hitachi Kenki Fine Tech Co., Ltd., MF 160), the presence or absence of voids was evaluated. FIG. 1 is an X-ray image of a silver sintered body obtained in Example 1, and FIG. 2 is an X-ray image of a silver sintered body obtained in Comparative Example 1. Voids are not observed in the silver sintered body obtained in Example 1. On the other hand, a patchy pattern was observed in the silver sintered body obtained in Comparative Example 1. This indicates that rough parts (voids) exist in the silver sintered body. It is to be noted that white circles are observed in FIGS. 1 and 2, but these are dents provided for improving the adhesion property of the silver paste composition to the lead frame, and do not particularly require to be positioned.

(2) Die Shear Strength 0.1 mg of the silver paste composition was applied onto a PPF-Cu lead frame (land: 10×5 mm), and a 1 mm×1 mm Au-plated Si chip (Au plating thickness: 0.1 µm, chip thickness: 400 µm) was bonded thereon. This was heated for 60 minutes at 220° C. on a hot plate (Iuchi Seieido Co. Ltd., SHAMAL HOTPLATE HHP-401) to manufacture a silver sintered body. It is to be noted that the rate of temperature increase until the temperature reached 200° C. from room temperature (25° C.) was about 27° C./sec.

The adhesive strength of the above-described silver sintered body was evaluated by die shear strength. The Au-plated Si chip was pressed in a horizontal direction at a measuring speed of 500 µm/sec and a measuring height of 100 µm, using a multipurpose bondtester (manufactured by DAVE, 4000 Series), and the die shear strength (MPa) of the silver sintered body was measured.

(3) Thermal Conductivity

The silver paste composition was subjected to heating treatment for 1 hour at 200° C. in a clean oven (manufactured by TABAIESPEC CORP., PVHC-210) to obtain a 10 mm×10 mm×1 mm silver sintered body. The thermal diffusivity coefficient of this silver sintered body was measured by a laser flash method (manufactured by NETZSCH, LFA 447, 25° C.). Furthermore, a product of this thermal diffusivity coefficient, the specific heat capacity measured by a differential scanning calorimetry device (manufactured by PerkinElmer Co., Ltd., Pyris1), and the specific gravity measured by an Archimedean method was determined to calculate the thermal conductivity (W/m·K) of the silver sintered body at 25° C.

(4) Volume Resistivity

The silver paste composition was applied onto a glass plate and subjected to heating treatment for 1 hour at 200° C. in a clean oven (manufactured by TABAIESPEC CORP., PVHC-210) to obtain a 1 mm×50 mm×0.03 mm silver sintered body. The volume resistivity of this silver sintered body was measured by a four-terminal method (manufactured by ADVANTEST CORPORATION, R687E DIGTAL MULTIMETER).

Example 1

As the silver particles, AgC239 (particle diameter 5.42 µm, flake, FUKUDA METAL FOIL & POWDER Co., Ltd.) and K-0082P (particle diameter 1.64 sphere, METALOR) were used. As the solvent, isobornyl cyclohexanol (boiling point 308° C., hereinafter, sometimes abbreviated as MTPH), tributyrin (boiling point 305° C., Wako Pure Chemical Industries, Ltd.), and stearic acid (boiling point 376° C., Wako Pure Chemical Industries, Ltd.) were used. The silver particles and the solvent were kneaded for 15 minutes with a stone mill at the blending ratio shown in Table 1 to manufacture a silver paste composition. The properties of this silver paste composition were measured to obtain the result shown in Table 1.

Example 2

As the silver particles, AgC239 (FUKUDA METAL FOIL & POWDER Co., Ltd.) and K-0082P (METALOR) were used. As the solvent, tributyrin (boiling point 305° C., Wako Pure Chemical Industries, Ltd.) and stearic acid (boiling point 376° C., Wako Pure Chemical Industries, Ltd.) were used. The silver particles and the solvent were kneaded for 15 minutes with a stone mill at the blending ratio shown in Table 1 to manufacture a silver paste composition. The properties of this silver paste composition were measured to obtain the result shown in Table 1.

Example 3

As the silver particles, AgC239 (FUKUDA METAL FOIL & POWDER Co., Ltd.) and K-0082P (METALOR) were used. As the solvent, tributyrin (boiling point 305° C., Wako Pure Chemical Industries, Ltd.), butyl stearate (boiling point 343° C., Wako Pure Chemical Industries, Ltd.), and stearic acid (boiling point 376° C., Wako Pure Chemical Industries, Ltd.) were used. The silver particles and the solvent were kneaded for 15 minutes with a stone mill at the blending ratio shown in Table 1 to manufacture a silver paste composition. The properties of this silver paste composition were measured to obtain the result shown in Table 1.

Example 4

As the silver particles, AgC239 (FUKUDA METAL FOIL & POWDER Co., Ltd.) was used. As the solvent, tributyrin (boiling point 305° C., Wako Pure Chemical Industries, Ltd.), butyl stearate (boiling point 343° C., Wako Pure Chemical Industries, Ltd.), and stearic acid (boiling point 376° C., Wako Pure Chemical Industries, Ltd.) were used. The silver particles and the solvent were kneaded for 15 minutes with a stone mill at the blending ratio shown in Table 1 to manufacture a silver paste composition. The properties of this silver paste composition were measured to obtain the result shown in Table 1.

Example 5

As the silver particles, K-0082P (METALOR) was used. As the solvent, tributyrin (boiling point 305° C., Wako Pure Chemical Industries, Ltd.), butyl stearate (boiling point 343° C., Wako Pure Chemical Industries, Ltd.), and stearic acid (boiling point 376° C., Wako Pure Chemical Industries, Ltd.) were used. The silver particles and the solvent were kneaded for 15 minutes with a stone mill at the blending ratio shown in Table 1 to manufacture a silver paste composition. The properties of this silver paste composition were measured to obtain the result shown in Table 1.

Comparative Example 1

As the silver particles, AgC239 (FUKUDA METAL FOIL & POWDER Co., Ltd.) and K-0082P (METALOR) were used. As the solvent, isobornyl cyclohexanol (boiling point 308° C.), dipropylene glycol methyl ether acetate (boiling point 209° C., Daicel Corporation, hereinafter, abbreviated as DPMA), and stearic acid (boiling point 376° C., Wako Pure Chemical Industries, Ltd.) were used. The silver particles and the solvent were kneaded for 15 minutes with a stone mill at the blending ratio shown in Table 1 to manufacture a silver paste composition. The properties of this silver paste composition were measured to obtain the result shown in Table 1.

TABLE 1

| Items | | | Example 1 | Example 2 | Example 3 | Example 4 | Example 5 | Comparative Example 1 |
|---|---|---|---|---|---|---|---|---|
| Composition [parts by mass] | Silver Particles | AgC239 | 46 | 46 | 46 | 92 | — | 46 |
| | | K-0082P | 46 | 46 | 46 | — | 92 | 46 |
| | Solvent | MTPH | 6 | — | — | — | — | 6 |
| | | Tributyrin | 6 | 12 | 6 | 6 | 6 | — |
| | | DPMA | — | — | — | — | — | 6 |
| | | Butyl Stearate | — | — | 6 | 6 | 6 | — |
| | | Stearic Acid | 1 | 1 | 1 | 1 | 1 | 1 |
| Thermal Conductivity [W/m · K] | | | 60 | 60 | 60 | 60 | 60 | 70 |
| Volume Resistivity [μΩ · cm] | | | 4.4 | 6.2 | 5.8 | 6.0 | 5.9 | 5.5 |
| Die Shear Strength [MPa] | | | 11 | 13 | 14 | 11 | 12 | 8.5 |
| Presence or Absence of Voids in Silver Sintered Body | | | Absence | Absence | Absence | Absence | Absence | Presence |

The invention claimed is:

1. A silver paste composition comprising:
silver particles having a particle diameter of 0.1 μm to 20 μm; and
a solvent component consisting of one or more solvents having a boiling point of 300° C. or more.

2. The silver paste composition according to claim 1, wherein the silver particles comprise at least one of flaky silver particles and spherical silver particles.

3. The silver paste composition according to claim 1, wherein one or more of the solvents comprises at least one of an ether bond and an ester bond.

4. A sintered body comprising:
silver sintered particles derived from heating the silver paste composition according to claim 1 at a temperature of less than 300° C., and
having a volume resistivity of $1\times10^{-4}$ Ω·cm or less, a thermal conductivity of 30W/m·K or more, and an adhesive strength of 10 MPa or more.

5. A semiconductor device comprising:
a semiconductor element;
a supporting member for mounting the semiconductor element; and
a sintered body derived from the silver paste composition according to claim 1 bonding the semiconductor element to the supporting member.

6. The silver paste composition according to claim 2, wherein one or more of the solvents comprises at least one of an ether bond and an ester bond.

7. A sintered body comprising:
silver sintered particles derived from heating the silver paste composition according to claim 2 at a temperature of less than 300° C., and
having a volume resistivity of $1\times10^{-4}$ Ω·cm or less, a thermal conductivity of 30W/m·K or more, and an adhesive strength of 10 MPa or more.

8. A sintered body comprising:
silver sintered particles derived from heating the silver paste composition according to claim 3 at a temperature of less than 300° C., and
having a volume resistivity of $1\times10^{-4}$ Ωcm or less, a thermal conductivity of 30W/m·K or more, and an adhesive strength of 10 MPa or more.

9. A sintered body comprising:
silver sintered particles derived from heating the silver paste composition according to claim 6 at a temperature of less than 300° C., and
having a volume resistivity of $1\times10^{-4}$ Ωcm or less, a thermal conductivity of 30W/m·K or more, and an adhesive strength of 10 MPa or more.

10. A semiconductor device comprising:
a semiconductor element;
a supporting member for mounting the semiconductor element; and
a sintered body derived from the silver paste composition according to claim 2 bonding the semiconductor element to the supporting member.

11. A semiconductor device comprising:
a semiconductor element;
a supporting member for mounting the semiconductor element; and
a sintered body derived from the silver paste composition according to claim 3 bonding the semiconductor element to the supporting member.

12. A semiconductor device comprising:
a semiconductor element;
a supporting member for mounting the semiconductor element; and a sintered body derived from the silver paste composition according to claim 6 bonding the semiconductor element to the supporting member.

13. The silver paste composition according to claim 3, wherein one or more of the solvents has a hydroxyl group.

14. The silver paste composition according to claim 6, wherein one or more of the solvents has a hydroxyl group.

15. The silver paste composition according to claim 1, wherein one or more of the solvents comprises a hydroxyl structure group.

16. The silver paste composition according to claim 2, wherein one or more of the solvents comprises a hydroxyl structure group.

17. A sintered body comprising:
silver sintered particles derived from heating the silver paste composition according to claim 15 at a temperature of less than 300° C., and
having a volume resistivity of $1\times10^{-4}$ Ω·cm or less, a thermal conductivity of 30W/m·K or more, and an adhesive strength of 10 MPa or more.

18. A sintered body comprising:
silver sintered particles derived from heating the silver paste composition according to claim 16 at a temperature of less than 300° C., and
having a volume resistivity of $1\times10^{-4}$ Ω·cm or less, a thermal conductivity of 30W/m·K or more, and an adhesive strength of 10 MPa or more.

19. A semiconductor device comprising:
a semiconductor element;
a supporting member for mounting the semiconductor element; and
the sintered body according to claim 17 bonding the semiconductor element to the supporting member.

20. A semiconductor device comprising:
a semiconductor element;
a supporting member for mounting the semiconductor element; and
the sintered body according to claim 18 bonding the semiconductor element to the supporting member.

21. The silver paste composition according to claim 1, wherein one or more of the solvents has a boiling point of 305° C. or more.

22. A silver paste composition comprising:
metal containing materials consisting of silver particles having a particle diameter of 0.1 μm to 20 μm; and
a solvent component consisting of one or more solvents having a boiling point of 300° C. or more.

23. A silver paste composition consisting of:
silver particles having a particle diameter of 0.1 μm to 20 μm; and
one or more solvents having a boiling point of 300° C. or more.

24. The silver paste composition according to claim 23, wherein the one or more solvents has a boiling point of more than 300° C.

25. The silver paste composition according to claim 22, wherein the solvent component consists of one or more solvents having a boiling point of more than 300° C.

26. The silver paste composition according to claim 1, wherein the solvent component consists of one or more solvents having a boiling point of more than 300° C.

* * * * *